(12) United States Patent
Sundar et al.

(10) Patent No.: US 7,226,269 B2
(45) Date of Patent: Jun. 5, 2007

(54) SUBSTRATE EDGE GRIP APPARATUS

(75) Inventors: Satish Sundar, Milpitas, CA (US);
 Sanjeev Baluja, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 399 days.

(21) Appl. No.: 10/758,753

(22) Filed: Jan. 15, 2004

(65) Prior Publication Data

US 2005/0158153 A1 Jul. 21, 2005

(51) Int. Cl.
 *B65G 49/07* (2006.01)

(52) U.S. Cl. .................. 414/744.5; 414/941; 294/116; 901/6

(58) Field of Classification Search .................. 414/941
 See application file for complete search history.

(56) References Cited

U.S. PATENT DOCUMENTS

| 4,411,576 | A | * | 10/1983 | Smith et al. ........... 414/224.01 |
| 4,724,621 | A |  | 2/1988 | Hobson et al. ............... 34/218 |
| 5,133,635 | A |  | 7/1992 | Malin et al. ............. 414/744.8 |
| 6,155,773 | A | * | 12/2000 | Ebbing et al. ........... 414/744.5 |
| 6,283,701 | B1 | * | 9/2001 | Sundar et al. ........... 414/744.5 |
| 6,322,312 | B1 | * | 11/2001 | Sundar ..................... 414/744.5 |
| 6,682,113 | B2 | * | 1/2004 | Cox et al. .................... 294/104 |

\* cited by examiner

*Primary Examiner*—James Keenan
(74) *Attorney, Agent, or Firm*—Patterson & Sheridan

(57) ABSTRACT

In one embodiment, the invention is a substrate edge gripper assembly for positioning a semiconductor substrate upon a transfer robot. In one embodiment, a modular assembly comprises spring loaded jaws that are mounted on either side of a robot end effector. The jaws are adapted to be actuated by a feature remote from the robot end effector to release the substrate for delivery.

11 Claims, 6 Drawing Sheets

SUBSTRATE EDGE GRIP APPARATUS

BACKGROUND OF THE INVENTION

1. Field of the Invention

The present invention relates generally to the processing of semiconductor substrates, and relates more particularly to apparatuses for gripping an edge of a semiconductor substrate on a robot blade.

2. Background of the Related Art

Semiconductor substrate processing is typically performed by subjecting a substrate to a plurality of sequential processes to create devices, conductors and insulators on the substrate. Each of these processes is generally performed in a process chamber configured to perform a single step of the production process. In order to efficiently complete the entire sequence of processing steps, a number of process chambers are typically coupled to a central transfer chamber that houses a robot to facilitate transfer of the substrate between the process chambers. A semiconductor processing platform having this configuration is generally known as a cluster tool, examples of which are the families of AKT PECVD, PRODUCER®, CENTURA® and ENDURA® processing platforms available from Applied Materials, Inc., of Santa Clara, Calif.

Generally, a cluster tool comprises a central transfer chamber generally surrounded by one or more process chambers. The process chambers are generally utilized to process the substrate, for example, performing various processing steps such as etching, physical vapor deposition, ion implantation, lithography and the like. The transfer chamber is typically coupled to a factory interface that houses a plurality of removable substrate storage cassettes, each of which houses a plurality of substrates. To facilitate transfer of a substrate between a vacuum environment of the transfer chamber and a generally ambient environment of the factory interface, a load lock chamber is disposed between the transfer chamber and the factory interface.

A substrate transfer robot is disposed in the cluster tool and used to transfer substrates between the process and load lock chambers. Proper positioning of the substrate on the blade of the transfer robot is critical to ensure that the substrate does not become damaged or misaligned during transfer to process chambers and to achieve repeatable processing results. Thus, the manner in which the transfer robot contacts and positions the substrate on the robot blade may affect the final processing results.

Existing methods for centering a substrate on the robot blade are typically passive in nature (e.g., in some embodiments, the substrate sits in a pocket in the blade or compensate for misalignment by altering the motion of the motor). While these methods have generally proven to be reliable and repeatable, processes directed at reducing dimensions during device fabrication are increasingly demanding finer, more accurate and repeatable substrate placement on the blade to ensure robust processing results. As such, it is desirable that more active positioning mechanisms be developed that are capable of accurately centering a substrate on a blade without damaging the substrate itself.

Therefore, there is a need for an improved apparatus for positioning a substrate on a robot blade.

SUMMARY OF THE INVENTION

In one embodiment, a substrate edge gripper assembly for positioning a semiconductor substrate upon a transfer robot is provided. In one embodiment, a modular assembly comprises spring loaded jaws that are mounted on either side of a robot end effectors, such as a substrate support blade. The jaws are adapted to be mechanically actuated by a feature remote from the robot, e.g., the edges of a slit valve, chamber wall and the like, to release the substrate for delivery.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the invention is a substrate edge grip apparatus for positioning a semiconductor substrate upon a transfer robot. In one embodiment, the apparatus comprises spring loaded, modular jaws that are mounted on either side of a conventional transfer robot. The jaws are adapted to be actuated by a feature remote from the robot, e.g., the edges of a slit valve, chamber wall and the like. The apparatus is adapted to be incorporated in a conventional transfer robot with little or no modifications necessary to the robot itself.

Figure 1:
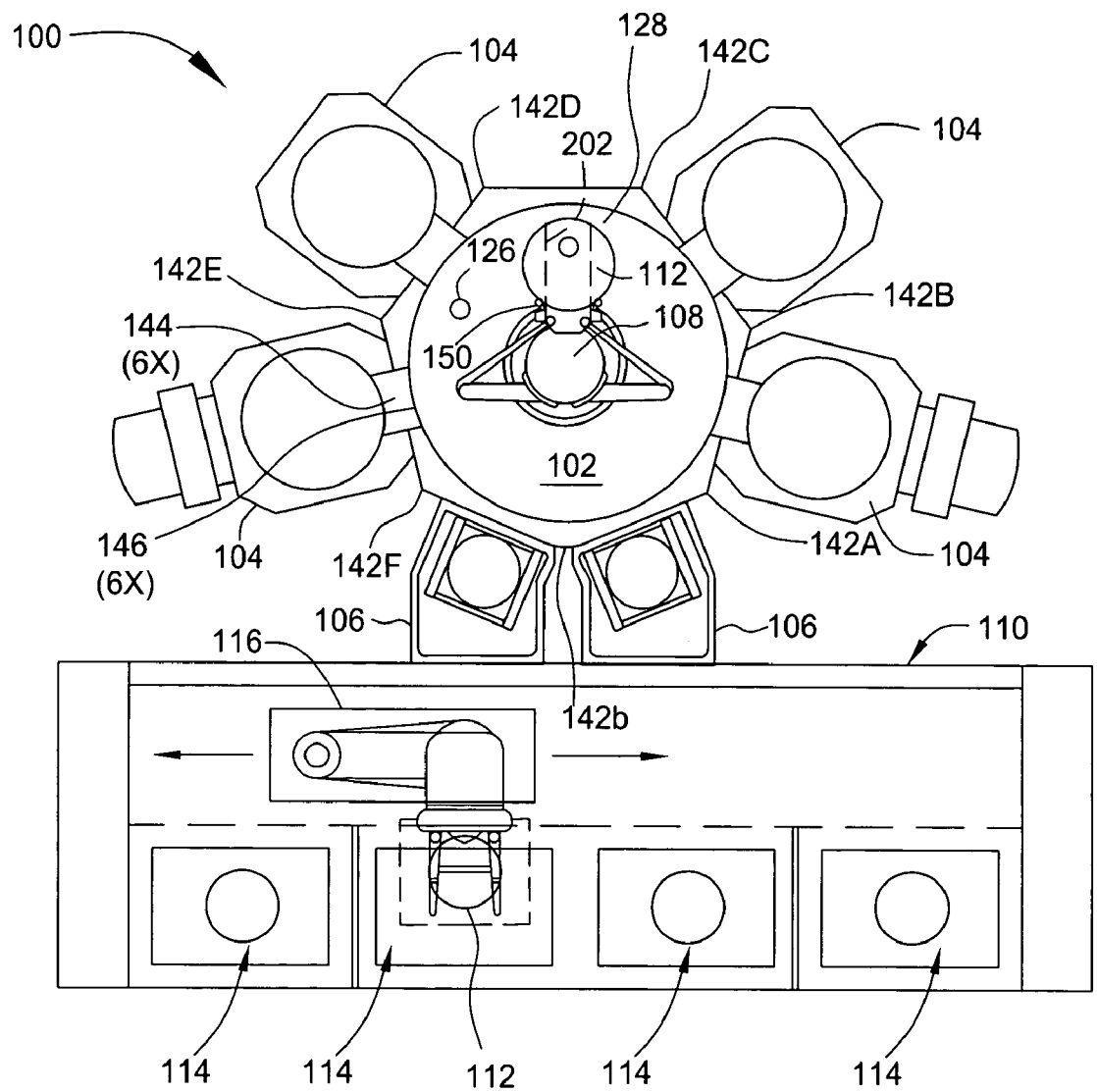
FIG. 1 is a plan view a semiconductor processing system having a transfer robot adapted to include one embodiment of a substrate edge gripper assembly according to the present invention.

FIG. 1 depicts one embodiment of a semiconductor processing system 100 that has been adapted to incorporate the substrate edge grip apparatus 150 of the present invention. The exemplary processing system 100 generally includes a transfer chamber 102 circumscribed by one or more processing chambers 104, a factory interface 110 and one or more load lock chambers 106. In the embodiment depicted in FIG. 1, two load lock chambers 106 are disposed between the transfer chamber 102 and the factory interface 110 to facilitate substrate transfer between a vacuum environment maintained in the transfer chamber 102 and a substantially ambient environment maintained in the factory interface 110. A transfer robot 108 having the edge grip apparatus 150 is centrally disposed in the transfer chamber 102 to move substrates between the chambers 104, 106. One example of a processing system which may be adapted to benefit from the invention is an CENTURA® processing system available from Applied Materials, Inc., located in Santa Clara, Calif. Although the edge grip apparatus 150 is coupled to a transfer robot is described herein with reference to the exemplary processing system 100, it is contemplated that the invention may be adapted and practiced in other processing systems having different configurations.

The factory interface FI 110 generally houses one or more substrate storage cassettes 114 and a FI robot 116. Each cassette 114 is configured to store a plurality of substrates 112 therein. The FI robot 116 is generally adapted to transfer substrates between the load lock chambers 106 and the substrate storage cassettes 114. The factory interface 110 is generally maintained at or near atmospheric pressure. In one embodiment, filtered air is supplied to the factory interface 110 to minimize the concentration of particles within the factory interface 110 and correspondingly enhance substrate cleanliness.

The transfer chamber 102 is fabricated from a structural material suitable for use under vacuum conditions, for example, an aluminum or steel alloy. In one embodiment, the transfer chamber 102 is fabricated from a single piece of aluminum alloy. The transfer chamber 102 defines an evacuable interior volume 128 through which substrates are transferred between the processing chambers 104 coupled to the exterior of the transfer chamber 102. A pumping system (not shown) is coupled to the transfer chamber 102 through a port 126 disposed on the chamber floor to maintain vacuum within the transfer chamber 102. In one embodiment, the pumping system includes a roughing pump coupled in tandem to a turbomolecular or a cryogenic pump.

The transfer chamber 102 includes a plurality of facets (shown by reference numerals 142A-G, and collectively referred to as "facets 142") for mounting the various processing and load lock chambers 104, 106 thereto. A passage 144 is formed through each facet 142 coupling the respective chambers 104, 106 to the interior volume 128 of the transfer chamber 102. Each passage 144 is selectively sealed by a slit valve 146 that is movable between a closed position that isolates the chamber environments and an open position that facilitates substrate transfer between the chambers 104, 106.

Each processing chamber 104 is typically bolted to one of the facets 142 on the exterior of the transfer chamber 102. Examples of processing chambers 104 that may be utilized include etch chambers, physical vapor deposition chambers, heat treatment chambers, chemical vapor deposition chambers, ion implantation chambers, orientation chambers, lithography chambers and the like. Different processing chambers 104 may be coupled to the transfer chamber 102 to provide a processing sequence necessary to form a predefined structure or feature upon the substrate surface.

The load lock chambers 106 are generally coupled between the factory interface 110 and the transfer chamber 102. The load lock chambers 106 are generally used to facilitate transfer of the substrates 112 between the vacuum environment of the transfer chamber 102 and the substantially ambient environment of the factory interface 110 without loss of vacuum within the transfer chamber 102. Each side of the load lock chambers 106 includes a substrate transfer passage that is selectively sealed by one of the slit valves 146 (shown only on the transfer chamber side of the load lock chambers 106) to selectively isolate the interiors of the load lock chambers 106 from the transfer chamber 102 and the factory interface 110.

The substrate transfer robot 108 is generally disposed in the interior volume 128 of the transfer chamber 102 to facilitate transfer of the substrates 112 between the various chambers circumscribing the transfer chamber 102. The transfer robot 108 may include one or more end effectors (blades 202 are shown in phantom in FIG. 1) utilized to support the substrate 112 during transfer. The transfer robot 108 may have two blades, each coupled to an independently controllable motor (known as a dual blade robot) or have two blades coupled to the transfer robot 108 through a common linkage. The axis of rotation of the transfer robot 108 is typically coaxial with a centerline of the transfer chamber 102 that extends perpendicular to the plane of FIG. 1 from which the robot motion is referenced. An example of a suitable substrate transfer robot is a VHP® transfer robot, commercially available from Applied Materials, Inc. of Santa Clara, Calif. It is contemplated that robots having other configurations suitable for use in vacuum environments may be utilized.

The substrate edge grip assembly 150 is mounted to the blade 202 of the transfer robot 108 for selectively gripping the edges of the substrate 112. The term blade used herein may be any type of robot end effector suitable for supporting a substrate during transfer. Although not shown for brevity in FIG. 1, the substrate edge grip assembly 150 may also be coupled to the FI robot 116, or other robot.

Figure 2:
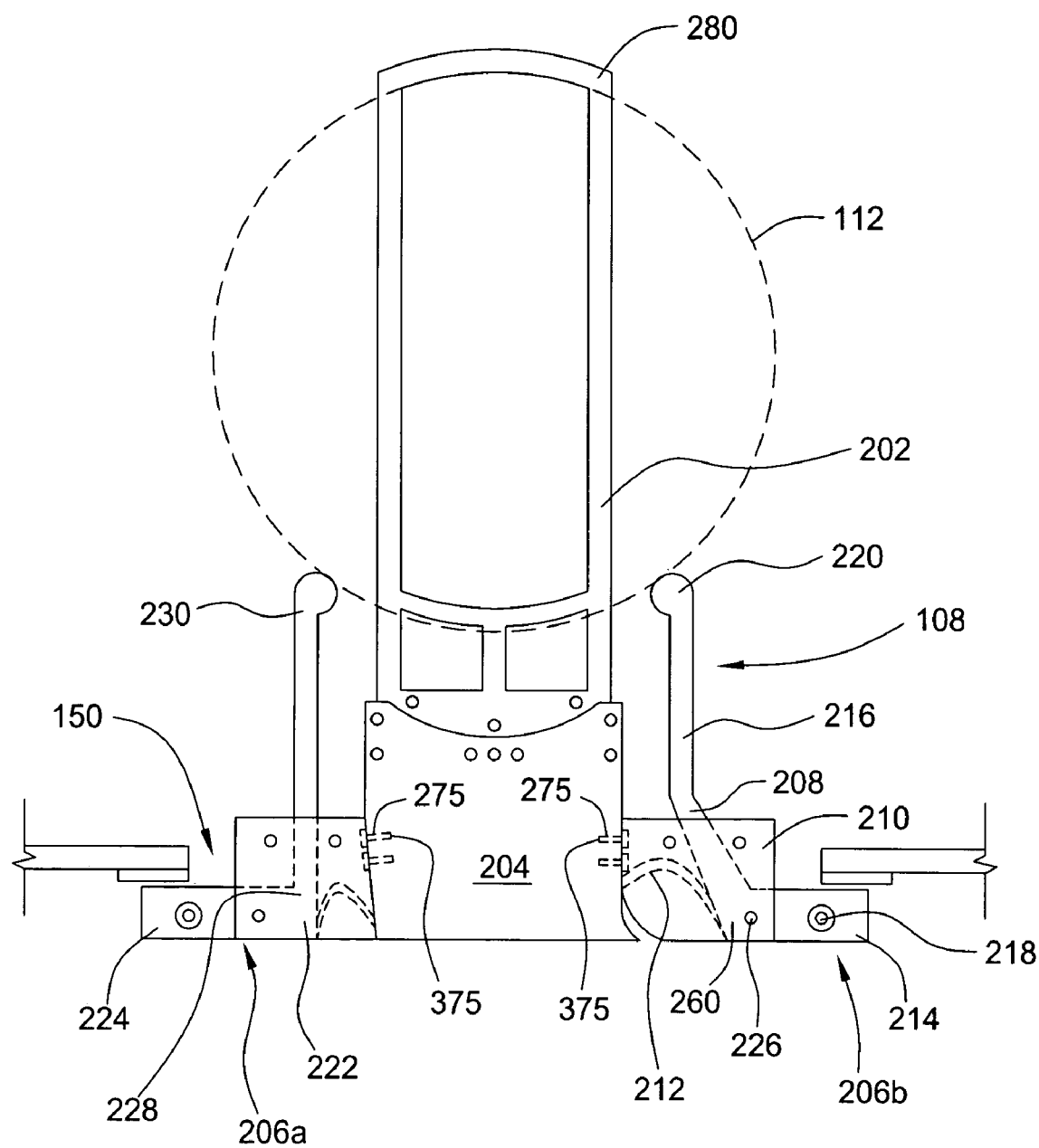
FIG. 2 is a top view of a substrate transfer robot adapted to include one embodiment of a substrate edge gripper assembly according to the present invention.

FIG. 2 is a top view of the transfer robot 108 that has one embodiment of the substrate edge grip assembly 150 of the present invention mounted thereto. In the embodiment illustrated in FIG. 2, the transfer robot 108 includes a single blade or end effector 202 coupled to a wrist 204, for supporting a substrate 112 (shown in phantom).

Figures 3A, 3B:
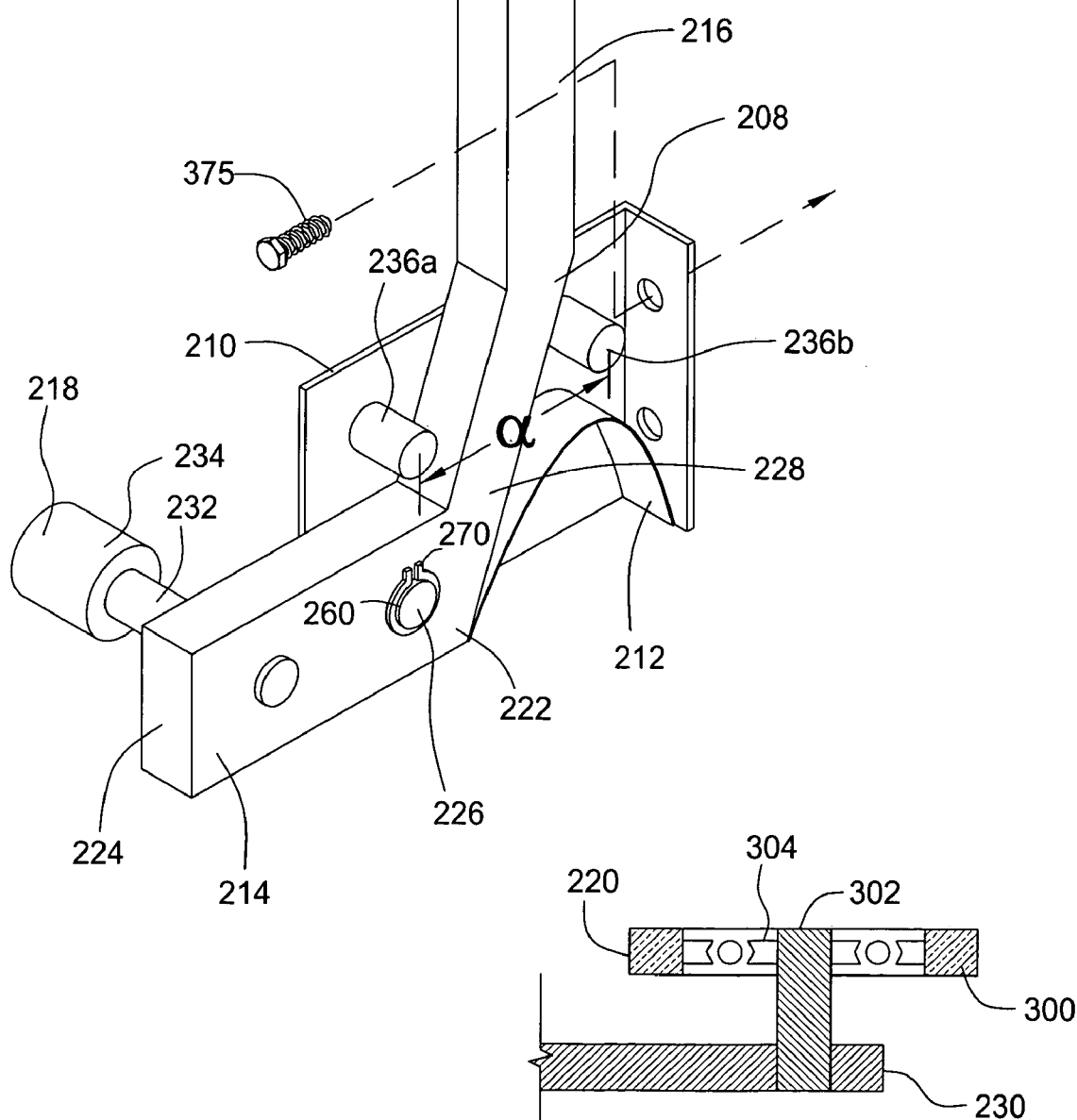
FIG. 3A is a bottom view of one embodiment of a jaw assembly.
FIG. 3B is a sectional view of one embodiment of a gripper of the jaw assembly of FIG. 3A.

The edge gripper assembly 150 generally comprises two jaw assemblies 206a and 206b (hereinafter collectively referred to as "jaw assemblies 206") adapted to be mounted to the wrist 204 of the transfer robot 108, in positions substantially lateral from a radial extension direction the blade 202 defined between the center axis of the robot 108 to the center of a substrate support disposed in one of the process or load lock chambers. Referring simultaneously to FIG. 2 and FIG. 3A, which is an isometric view of one jaw assembly 206b (jaw assembly 206a being substantially configured in a mirror image of jaw assembly 206b), each jaw assembly 206 comprises a jaw 208, a mounting bracket 210, and a biasing element 212.

The mounting bracket 210 is adapted for mounting the jaw assembly 206 to the wrist 204 of the robot blade 202. In one embodiment, the mounting bracket 210 is formed from a substantially rigid material such as aluminum or stainless steel. In one embodiment, the mounting bracket 210 is mounted to the wrist 204 by a bolt 375 that is threaded into a hole 275 formed in the robot blade 202. The jaw assembly 206 is configured not to substantially increase the height or width of the blade 202. In this way, the jaw assembly 206 may be retrofitted to existing robots, and fit through existing slit valves, with little or no modification.

The jaw 208 comprises a base 214, an arm 216, a striker 218 and a gripper 220. The base 214 is adapted for mounting to the mounting bracket 210 and comprises a substantially polygonal plate having a first end 222 and a second end 224. The base 214 includes a pivot hole 260 sized to accept a pin 226 for mounting the base 214 to the mounting bracket 210. The base 214 is rotatable relative to the mounting bracket 210 about the pin 226. In one embodiment, the pin 226 and pivot hole 260 are formed from materials advantageously suitable for contact during relative rotation and minimizes particle generation. In another embodiment, the pin 226 and pivot hole 260 are separated by a bearing surface, such as a ball, roller or sleeve bearing, to facilitate relative rotation. In another embodiment, depicted in FIG. 3A, the pin 226 is retained within the pivot hole 260 by a retaining ring 270.

The arm 216 has a first end 228 that is coupled to the first end 222 of the base 214, and a second end 230 that extends outwardly from the base 214, i.e., as a cantilever. In one embodiment, the base 214 and the arm 216 form a substantially L-shaped structure. The gripper 220 is coupled to the second end 230 of the arm 216. The grippers 220 are adapted for clamping the substrate 112 by its edge against a lip 280 extending upward from a distal end of the robot blade 202.

In one embodiment illustrated in FIG. 3B, the gripper 220 includes a rotatable disk 300 adapted to capture an edge of the substrate 112. The rotation of the disk 300 enables the gripper 220 to roll along the edge of the substrate 112 and maintain accurate positioning of the substrate 112 while substantially reducing damage to the substrate edges. The disk 300 is rotatably supported upon a shaft 302 that is press fit or otherwise coupled to the second end 230 of the arm 216. The shaft 302 extends upward from the second end 230 of the arm 216 at an angle substantially normal to the arm 216. In one embodiment, a bearing 304, such as a ball, roller, or sleeve bearing, supports the disk 300 for rotation upon the shaft 302. In one embodiment, the disk 300 is formed from a substantially rigid material, such as of anodized aluminum. Alternatively, the gripper 220 may be fabricated from stainless steel, polymeric, ceramic or other material suitable for clamping a substrate disposed a processing chamber.

Returning to FIGS. 2 and 3A, the striker 218 is coupled to the second end 224 of the base 214 and in one embodiment projects upward therefrom, at an angle substantially normal to the base 214 and the arm 216 and substantially parallel to the pin 260 that couples the arm 216 to the mounting bracket 210. In one embodiment, the striker 218 comprises a shaft 232 and a roller 234 that is adapted to rotate about an axis substantially normal the base 214 and substantially parallel to the axis of the gripper assembly rotation. In one embodiment, the roller 234 is formed from a substantially inert polymer such as polyimide or polyetheretherketone, among other materials. Alternatively, the striker 218 may project downward from the second end 224 of the base 214.

The biasing member 212 is coupled between the base 214 of the jaw 208 and the mounting bracket 210. The biasing member 212 is generally adapted to bias the arm 216 and gripper 220 toward the center of the substrate 112. In one embodiment, the biasing member 212 is a flat spring having a first end coupled to the base 214 of the jaw 208 and a free end disposed against an interior surface of the mounting bracket 210. Alternatively, the biasing member 212 may be a compression spring, a torsion spring, a gas spring, a magnet, a resilient material, a spring form, a linear actuator, a solenoid, or other device suitable for moving the arm 216 toward the center of the substrate 112.

Figure 4:
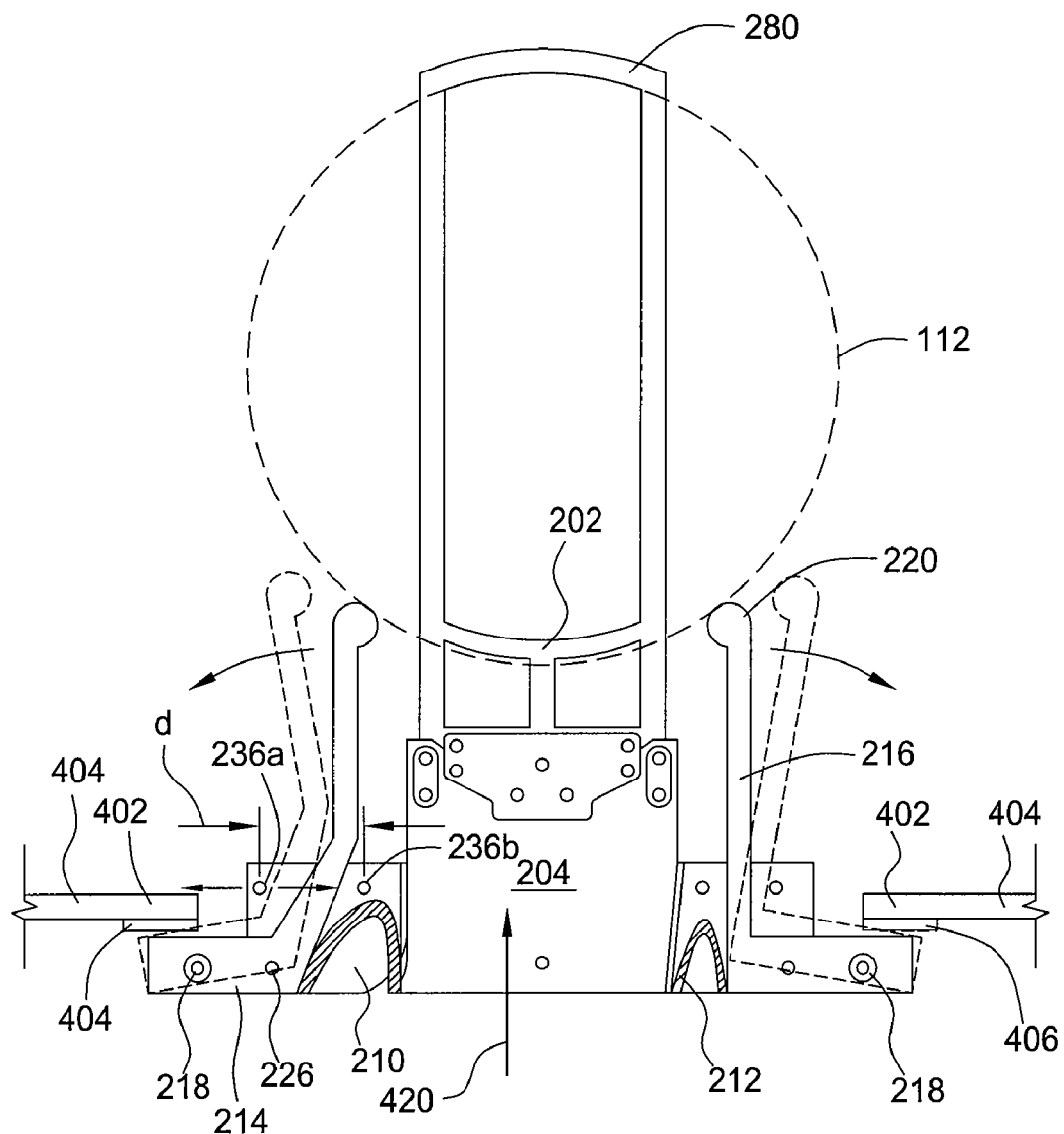
FIG. 4 is a bottom view of the transfer robot and substrate edge gripper assembly illustrated in FIG. 2.

Referring simultaneously to FIG. 3A and to FIG. 4, which is a bottom view of the substrate edge grip assembly 150 illustrated in FIG. 2, the jaw 208 is biased to rotate about the pin 226 (as shown in phantom in FIG. 4). In another embodiment, the mounting bracket 210 further includes a set of pins 236a and 236b (or other suitable mechanism) for restricting rotation of the arm 216. In one embodiment, the pins 236a and 236b are spaced apart from each other by a distance d that is large enough to accommodate the width of the arm 216 positioned therebetween, plus a pre-defined range of arm displacement. The inner pin 236b is positioned to prevent the jaw 208 from moving radially inward to a position that would displace the substrate 112 off center. The outer pin 236a is positioned to limit the size of the opening between the jaws 208. In one embodiment, at least one of the pins 236a and 236b is moveable to adjust the distance d that separates the pins 236a and 236b, and ultimately, the position of the grippers 220 of the arms 216.

As illustrated in FIGS. 2 and 4, the jaw assemblies 206 are mounted to the wrist 204 of the transfer robot 202 so that the arms 216 are orientated substantially parallel to each other and to the robot blade 202 when in an un-actuated or "closed" position (e.g., before the transfer robot 108 fully enters a processing chamber). The grippers 220 contact the edges of the substrate 112 to maintain the substrate 112 in a substantially centered position upon the robot blade 202. As the transfer robot 108 enters a processing chamber to deliver the substrate 112, the forward motion of the transfer robot 108 causes the strikers 218 to contact a lateral surface of the chamber (e.g., a chamber wall or an edge 402 of the slit valve 404). Thus, the jaw assemblies 206 are actuated mechanically by a structure remote from (e.g., not a part of) the robot 108. This convention of using a feature of the system 100 remote from the robot 108 allows the gripper assembly 150 to be advantageously retro-fitted on existing systems with minimal cost and complexity.

Figure 5:
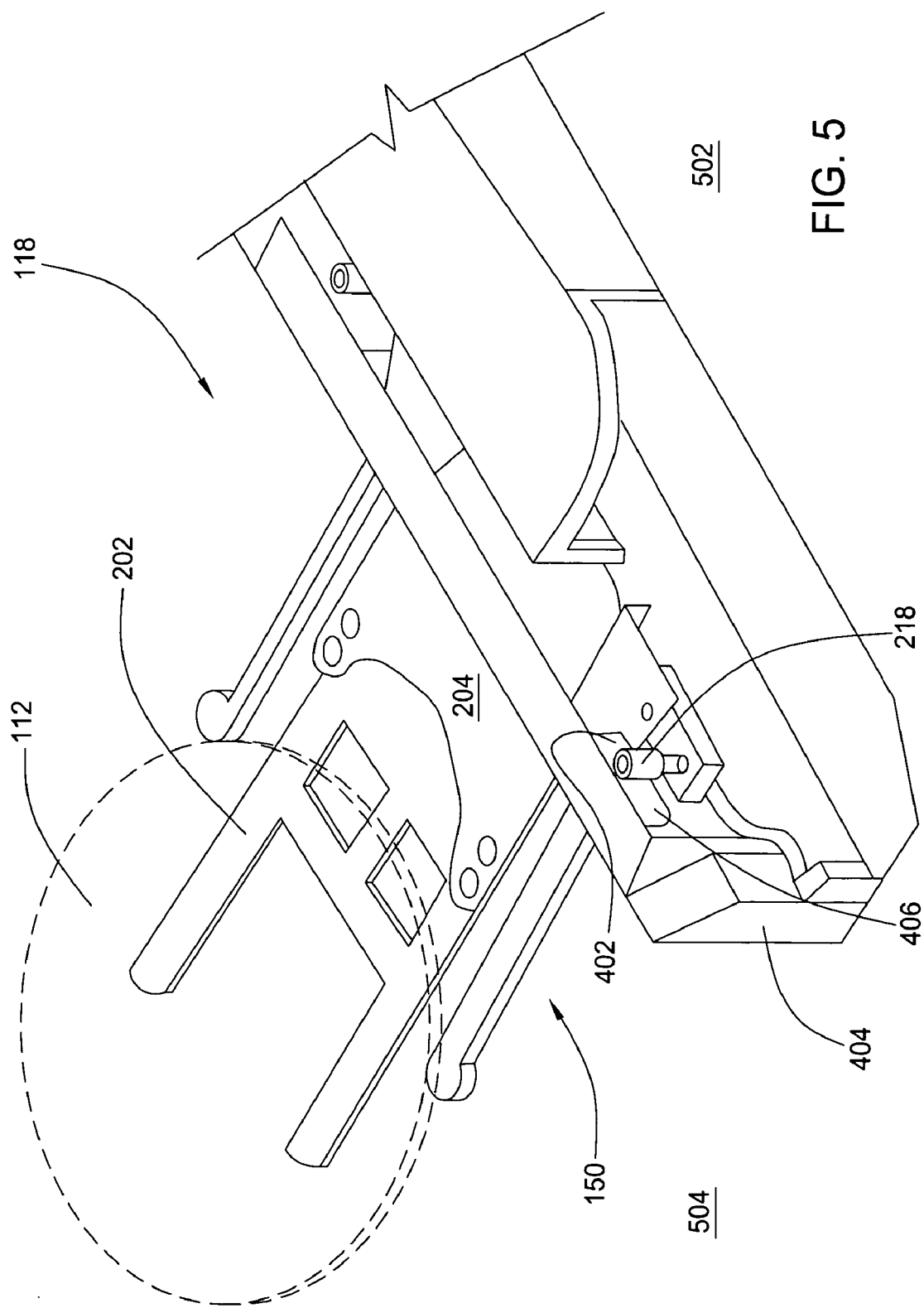
FIG. 5 is an isometric view showing the substrate edge gripper assembly of FIG. 2 being actuated by contact with a slit valve.

In one embodiment illustrated in isometric view in FIG. 5, the strikers 218 contact an edge 402 of the slit valve 404 between the transfer chamber 502 and the processing chamber 504. In one embodiment, striker pads 406 may be mounted to the edges 402 of the slit valve 404 to absorb contact between the strikers 418 and the slit valve perimeter. In one embodiment, the striker pads 406 are formed from a substantially rigid material such as aluminum or stainless steel.

Referring back to FIG. 4, contact between the strikers 218 and the edges 402 of the slit valve 404 and/or striker pads 406 occurs as the blade 202 is extended out of the transfer chamber through the slit valve and into the process (or load lock) chamber as shown by arrow 420. As the strikers 218 contact the pads 406, the jaws 208 are forced to rotate about the pin 226. The arms 216 rotate outward relative to the robot blade 202 to an "open" position (shown in phantom in FIG. 4), thereby releasing the edges of the substrate 112 so that the substrate 112 may be transferred to a support assembly (not shown) within the processing chamber. Conversely, when entering a chamber to retrieve a substrate disposed therein, the grippers 220 rotate to clamp the substrate against the lip 280 as the strikers 218 are moved away from the pads 406 as the blade 202 is removed from the chamber in a direction opposite the arrow 420.

Figure 6:
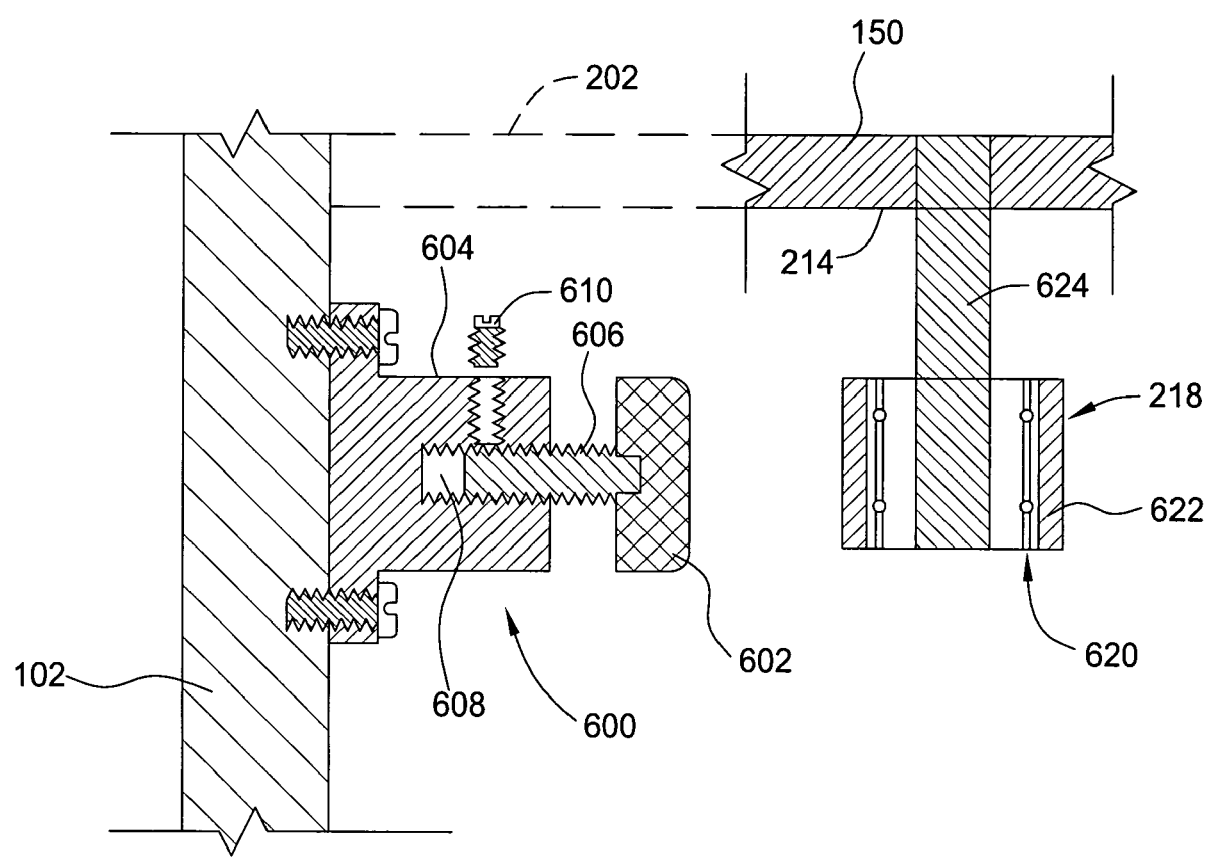
FIG. 6 is an isometric view of another embodiment of a substrate edge gripper assembly according to the present invention.

FIG. 6 is another embodiment of a of striker pad 602 that may be adjusted to set the actuation point of the striker 218 of the edge gripper assembly 150. The striker pad 602 is coupled to a threaded stud 606 that engages a hole 608 formed in a strike pad mounting bracket 604. The mounting bracket 604 is coupled to the slit valve or a wall of the transfer chamber 102. The hole 608 may be alternatively be formed in the slit valve or a wall of the transfer chamber 102.

The length of engagement between the stud 606 and hole 608 may be adjusted to set the pad 602 at a predefined length for the wall of the transfer chamber 102, thereby setting the actuation point (i.e., where the striker 218 first contacts pad 602) as the gripper assembly 150 attached to the blade 202 enters a processing or load lock chamber through the slit valve. The adjustability of the actuation point advantageously ensures that the gripper assembly 150 is adequately clear from the substrate to allow transfer between the blade 202 and substrate support.

A locking mechanism may be employed to fix the position of the pad 602. In one embodiment, the locking mechanism is a set screw 610 disposed in a cross hole formed in the bracket 604. The set screw 610 may be tightened to engage the stud 606, thereby preventing the stud 606 from turning. It is contemplated that other types of locking mechanisms may be employed, such as lock nuts, thread lockers, locking inserts and the like.

In the embodiment depicted in FIG. 6, the striker 218 may optionally include a sleeve 622 coupled to a shaft 624 extending from the base 214. A bearing 620 is disposed between the sleeve 622 and the shaft 624 to allow the sleeve 622 to rotate when in contact with the pad 602 as the blade 202 moves through the slit valve. The bearing 620 may be a ball bearing, roller bearing, sleeve bearing or the like. The rotating sleeve 622 advantageously reduces particle generation and extends the service life of both the pad 602 and sleeve 624.

The substrate edge gripper assembly 150 thus enables accurate positioning of a semiconductor substrate 112 on the blade 202 of the robot 108, reducing the probability of substrate or device damage due to misalignment. Moreover, the clamping of the substrate 112 to the blade 202 allows faster robot motion without movement of the substrate on the blade 202, thereby reducing the time required for substrate transfers, which, in some processing sequences, increases substrate throughput.

Additionally, as the height of the edge gripper assembly 150 is not substantially higher than the height of the wrist 204, the edge gripper assembly 150 does not impeded the ability of the robot blade 202 to pass through the slit valve 404, thereby making the edge gripper assembly 150 easily retro-fittable to existing robots with little cost or complexity. Thus, the present invention represents a significant advancement in the field of semiconductor substrate processing.

While the foregoing is directed to the preferred embodiment of the present invention, other and further embodiments of the invention may be devised without departing from the basic scope thereof, and the scope thereof is determined by the claims that follow.

| REFERENCE NUMERALS | |
|---|---|
| Semiconductor processing system | 100 |
| Transfer chamber | 102 |
| Processing chambers | 104 |
| Load lock chambers | 106 |
| Transfer robot | 108 |
| Factory interface FI | 110 |
| Substrates | 112 |
| Storage cassettes | 114 |
| FI robot | 116 |
| Port | 126 |
| Interior volume | 128 |
| Facet | 142 |
| Passage | 144 |
| Slit valve | 146 |
| Edge grip Apparatus | 150 |
| Blades | 202 |
| End effectors | 202 |
| Wrist | 204 |
| Jaw assemblies 206A and 206b | 206 |
| Jaws | 208 |
| Mounting bracket | 210 |
| Biasing element | 212 |
| Base | 214 |
| Arm | 216 |
| Striker | 218 |
| Gripper | 220 |
| First end | 222 |
| Second end | 224 |
| Pin | 226 |
| First end | 228 |
| Second end | 230 |

| -continued | |
|---|---|
| REFERENCE NUMERALS | |
| Shaft | 232 |
| Roller | 234 |
| Inner Pins | 236a |
| Outer Pins | 236b |
| Pivot hole | 260 |
| Pin | 270 |
| Hole | 275 |
| Retaining ring | 270 |
| Lip | 280 |
| Rotatable disk | 300 |
| Shaft | 302 |
| Bearing | 304 |
| Bolt | 375 |
| Edge | 402 |
| Slit valve | 404 |
| Striker pads | 406 |
| Strikers | 418 |
| Arrow | 420 |
| Transfer chamber | 502 |
| Processing chamber | 504 |
| Striker pad | 602 |
| Mounting bracket | 604 |
| Threaded stud | 606 |
| Hole | 608 |
| Set Screw | 610 |
| Bearing | 620 |
| Sleeve | 622 |
| Shaft | 624 |

What is claimed is:

1. A system for processing semiconductor substrates comprising:

a chamber comprising at least one substrate transfer passage formed in the chamber and a slit valve adapted to selectively seal the transfer passage;

a robot adapted for substrate transfer, the robot being disposed within the chamber and having an end effector;

a gripper assembly coupled to the robot and configured to retain a circular semiconductor substrate on the end effector, the gripper assembly being mechanically actuatable by a structure remote from the robot and end effector during substrate transfer; wherein the gripper assembly comprises:

at least two rotatable jaws, one jaw being positioned laterally on either side of the robot end effector;

a mounting bracket adapted for mounting each of the at least two jaws to a portion of the robot end effector; and a biasing member disposed between each of the at least two jaws and the mounting brackets, adapted for urging the at least two jaws to rotate about an axis substantially normal to the robot end effector;

wherein the system further comprises:

a striker plate positioned adjacent the transfer passage to engage the gripper assembly as the end effector is moved through the passage, the striker plate being positionable along a direction defined by an axis of extension of the end effector through the passage; and a mounting block coupled to at least one of the chamber and slit valve, the block having a threaded hole for receiving a stud extending from the striker plate.

2. The system of claim 1, wherein each of the at least two jaws comprises:

a base portion coupled directly to the mounting bracket, the base portion having a first end and a second end;

an arm coupled at a first end to the first end of the base portion and extending outwardly therefrom;

a striker coupled to the second end of the base portion and extending therefrom at an angle substantially normal to the base portion; and a gripper coupled to a second end of the arm.

3. The system of claim 2, wherein the jaws are adapted to rotate outward relative to the robot end effector upon contact of the striker with the structure remote from the robot.

4. The system of claim 2, wherein the gripper comprises:
a shaft having a first end coupled to the second end of the arm and extending outwardly therefrom at an angle substantially normal to the arm; and
a disk supported for rotation upon a second end of the shaft.

5. The system of claim 4 further comprising:
a bearing disposed between the shaft and disk.

6. The system of claim 2, wherein the striker comprises:
a shaft projecting from the base portion at an angle substantially normal to the base portion; and
a sleeve coupled to the shaft and adapted to rotate about a longitudinal axis of the shaft.

7. The system of claim 6 further comprising:
a bearing disposed between the shaft and sleeve.

8. The system of claim 1, wherein the structure for actuating the gripper is at least one of the chamber or a slit valve disposed in the chamber.

9. The system of claim 1 further comprising:
a locking mechanism for fixing the engagement of the stud and the threaded hole.

10. The system of claim 1, wherein each of the at least two rotatable jaws further comprises:
a base portion having a first end and a second end, the base portion pivotably coupled to the mounting bracket between the first and second ends;
a pivot hole disposed through the first end of the base portion; and
a pin disposed through the pivot hole and coupling the jaw to the mounting bracket.

11. The system of claim 1, wherein the mounting bracket further comprises:
a first pin extending outwardly from the mounting bracket; and
a second pin extending outwardly from the mounting bracket, the jaw separating the first and second pins, wherein a position of at least one of the pins is adjustable to limit the displacement of the jaw.

* * * * *